United States Patent [19]
Debus, Jr. et al.

[11] Patent Number: 4,831,382
[45] Date of Patent: May 16, 1989

[54] ANALOG-TO-DIGITAL CONVERTER WITH ADAPTABLE QUANTIZING LEVELS

[75] Inventors: Walter Debus, Jr., Nottingham, N.H.; Gerhard W. Stenger, Haverhill, Mass.

[73] Assignees: American Telephone and Telegraph Company, New York, N.Y.; AT&T Bell Laboratories, Murray Hill, N.J.

[21] Appl. No.: 53,939

[22] Filed: May 26, 1987

[51] Int. Cl.$^4$ ............................................. H03M 1/34
[52] U.S. Cl. .................................... 341/200; 341/118; 341/155
[58] Field of Search ................. 340/347 AD; 341/118, 341/155, 200

[56] References Cited

U.S. PATENT DOCUMENTS

| | | | |
|---|---|---|---|
| 3,261,012 | 7/1966 | Bentley | 340/347 |
| 3,298,014 | 1/1967 | Stephenson | 340/347 AD |
| 3,736,511 | 5/1973 | Gibson | 375/17 |
| 3,872,434 | 3/1975 | Duvall | 340/347 AD |
| 4,193,066 | 3/1980 | Morrison et al. | 340/347 |
| 4,642,694 | 2/1987 | Yamagishi et al. | 358/236 |

OTHER PUBLICATIONS

The Engineering Staff of Digital Equipment Corporation, "Analog–Digital Converson Handbook," 1964, pp. 20–22.
Sklar, "2's Complement Arithmetic Operations," Computer Design, May 1972, pp. 115 & 116.
Orbach, Zvi, "New Types of Adaptive Quantizers," IEEE Transactions on Acoustics, Speech, and Signal Processing, vol. ASSP-32, No. 5, Oct. 1984, pp. 1006–1013.

Primary Examiner—William M. Shoop, Jr.
Assistant Examiner—Brian K. Young
Attorney, Agent, or Firm—David R. Padnes

[57] ABSTRACT

An analog-to-digital converter having adaptable quantizing levels which compensate for unintended variations in the analog input signal amplitude. Variations in the amplitude range over which the quantizing levels extend is determined from an examination of preselected bits of the analog-to-digital converter output.

14 Claims, 3 Drawing Sheets

ANALOG-TO-DIGITAL CONVERTER WITH ADAPTABLE QUANTIZING LEVELS

TECHNICAL FIELD

The present invention relates to an analog-to-digital converter and, more particularly, to an analog-to-digital (A/D) converter whose quantizing levels are adjusted in response to variations in the range of the analog signal amplitude.

BACKGROUND OF THE INVENTION

A/D converters are a basic building block for the system designer and a myriad of different designs are available. In certain system applications, the analog input signal is subject to unpredictable and significant attenuation. In other applications, the incoming analog signal at a hub location arrives from a number of remote locations via different communication paths. The signal amplitude in these paths experience unwanted amplitude fluctuations which vary in time and from one path to another. Such signal effects can decrease the sensitivity provided by an A/D converter used in these system applications and, in turn, result in substantially degraded system performance. One way of compensating for such effects is to interconnect an automatic gain control device in the analog input signal path to maintain a predetermined signal amplitude. While this arrangement provides satisfactory results, the resulting circuitry can be complex and not amenable to meet the size and cost objectives of certain system applications. Accordingly, an A/D converter which maintains a prescribed sensitivity during the presence of analog signal amplitude fluctuations and which can be provided with digital devices at low cost would be desirable.

SUMMARY OF THE INVENTION

In its broadest aspect, the present invention overcomes the shortcomings of the prior art by adjusting the distance between the quantizing levels of an A/D converter in response to an examination of the converter's digital output signals. This arrangement advantageously maintains the amplitude swing of the analog A/D converter input signal within the distance between the outermost quantizing levels so as to maintain a constant converter sensitivity. In the disclosed embodiment, selected bits of the A/D digital output are examined by circuitry which expands or compresses the distance between the outermost quantizing levels for which the other quantizing levels are derived.

An aspect of the present invention is that it can be readily adapted to system applications wherein the analog input signal arrives in bursts or packets. In such system applications, the quantizing levels are maintained at the existing states during the absence of an analog input signal. Another aspect of the present invention is that it can be arranged to store the adjusted quantizing levels for analog signals arriving from each of a plurality of different communications paths. The adjusted quantizing levels associated with a given path are then used in the A/D converter each time the analog signal arrives over the given path.

DETAILED DESCRIPTION

Figure 1:
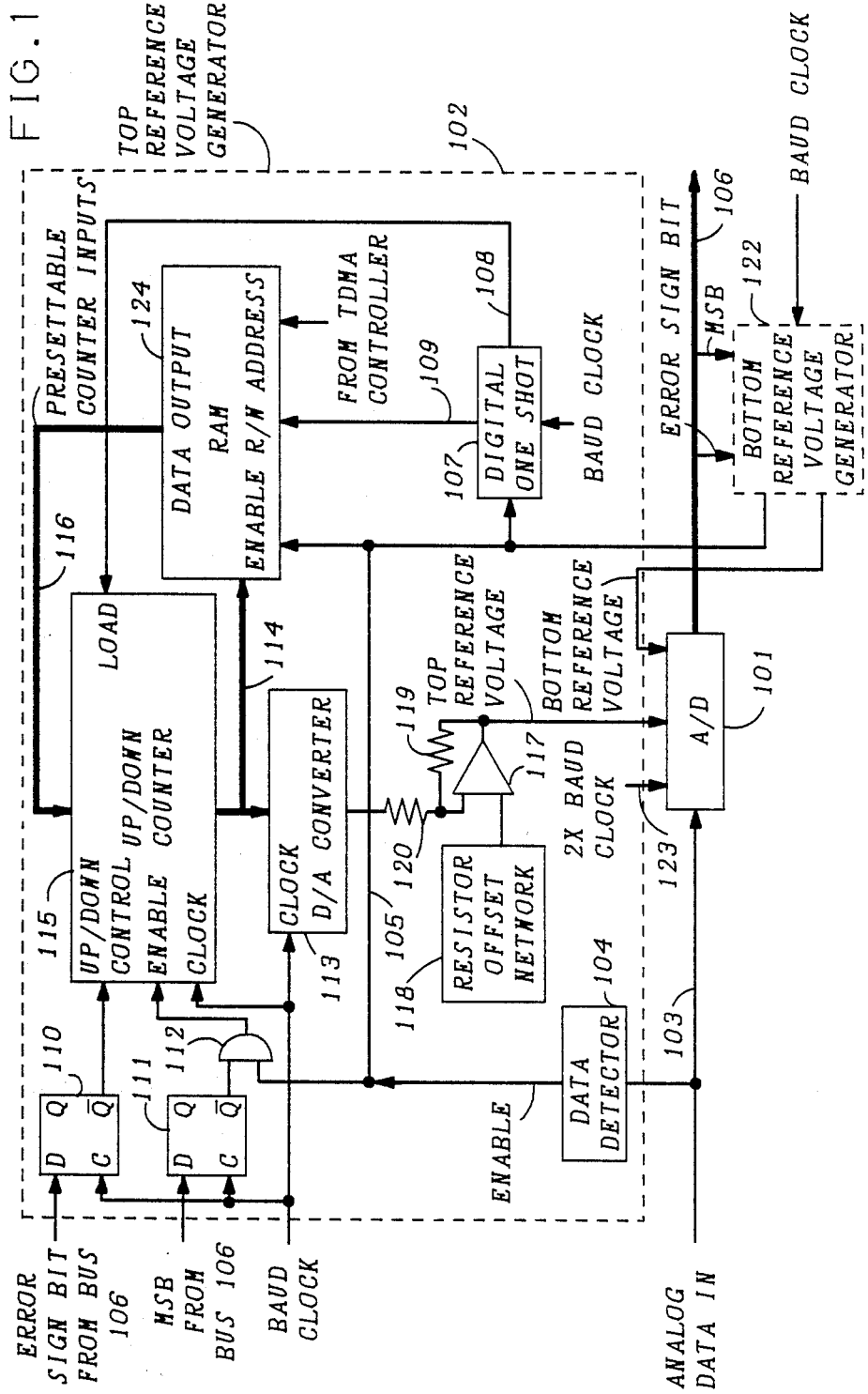
FIG. 1 is a block schematic diagram of an embodiment of the present invention.

Referring to FIG. 1, an analog data signal on lead 103 is coupled to A/D converter 101 and data detector 104. This analog signal conveys information on a plurality of discrete amplitude levels at a predetermined baud or symbol rate. While these information-carrying amplitude levels are generally fixed at the transmitter, distortion over the transmission channels causes the information-carrying signal levels in the received analog data signal to vary.

A/D converter 101 quantizes the analog signal amplitude on each occurrence of a clock signal to the closest one of a number of quantizing levels. This clock signal, at twice (2×) the baud rate, is coupled to A/D converter 101 via lead 123. The number of quantizing levels utilized by converter 101 is variable and depends on the system application. In general, there can be two or more such levels. Each output of A/D converter 101 appears on bus 106 in the form of a digital word having a predetermined number of bits. Predetermined ones of these bits are coupled to top reference voltage generator 102 and bottom reference voltage generator 122 which, as will be described, adjust a pair of reference voltage levels in response to variations in the analog signal amplitude so that this adjustment assures that the voltage swing of the incoming analog data signal always lies within the distance between the outermost quantizing levels. As a result, the sensitivity or accuracy of the A/D converter output is maintained despite undesired attenuation or amplification of the incoming analog data signal.

Figure 2:
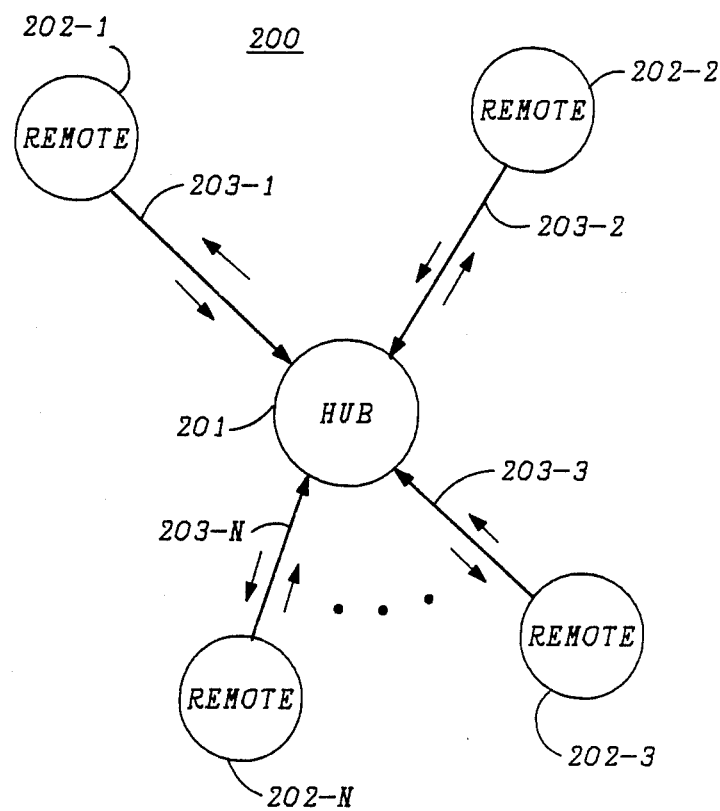
FIG. 2 is a block diagram of an illustrative system to which disclosed embodiment pertains.

Refer now to FIG. 2 which shows an illustrative radio system using time division multiple access (TDMA) to which the present invention pertains. As shown, system 200 provides two-way radio cummunications between a hub location 201 and a plurality of remote locations 202-1, 202-2 . . . 202-N. An A/D converter, in accordance with the present invention, is disposed at the hub and at each remote. Data arrives at the hub and remote locations in bursts, with the exception that if the hub is loaded to capacity, its A/D converter is supplied with a continuous analog input signal.

The communications channels 203-1 through 203-N between each remote location and the hub are different and subject at any given time to different degrees of fading and other forms of distortion. For example, in an actual system, the incoming signal at the hub location may contain short-term power level variations of +/−2 dB, while the incoming signal at a remote location may contain long-term, power level variations of several dB. Short-term variations are those that occur from one data burst to the next and occur at the hub location, for example, when remote locations with different power levels transmit information to the hub location in adjacent bursts. Long-term power level variations occur more gradually and can have periods of days, years, or the system lifetime and occur at either a hub or remote location, for example, when the radio system's automatic gain control does not fully compensate for a change in the transmitted signal power caused by the distortion over the channel, such as fading. In any event, such unwanted variations reduce the sensitivity provided by many A/D converters if the total possible number of levels to which the analog signal can be quantized varies. The present invention can be adapted to use in the illustrated hub or remote locations and can be used in systems wherein the transmission is not continuous to preclude any degradation in the sensitivity provided by an A/D converter in the presence of unintended variations in the power level or amplitude of the analog data signal.

Figure 3:
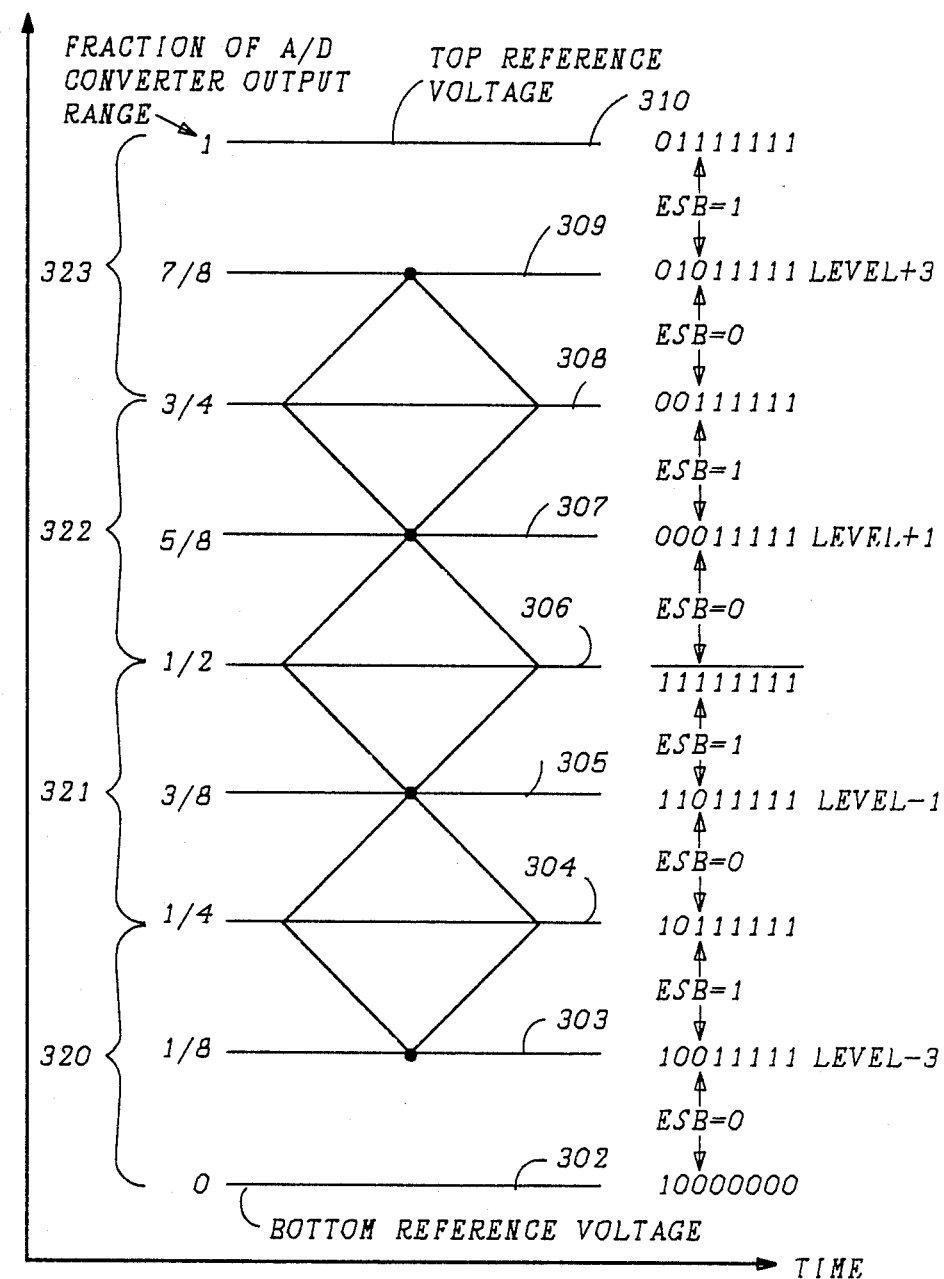
FIG. 3 is a diagram which is useful for understanding the operation of the disclosed embodiment.

To best understand the operation of the disclosed embodiment, refer now to FIG. 3. For purposes of illustration, it shall be assumed that A/D converter 101 utilizes 256 uniformly separated quantizing levels and that the incoming analog data signal on lead 103 is in the form of an amplitude modulated pulse sequence derived from one carrier to a pair of quadrature-related carrier signals. Each of such carriers were modulated at a transmitter using a 16 QAM format. It is understood, of course, that the present invention is not limited to such a modulation format but can be used with any format from which a pulse amplitude modulated seqeunce can be derived.

FIG. 3 shows an idealized signal-eye diagram 301 for a 16 QAM modulation format and nine of the quantizing levels used by A/D converter 101. These nine quantizing levels are designated as 302-310. Two of these nine levels, namely, outermost levels 302 and 310, are also the top and bottom reference voltage levels. Levels 302, 304, 306, 308 and 310 define the boundaries of four sub-regions, 320-323, and the midpoint of each of these sub-regions respectively coincides with levels 303, 305, 307 and 309. The remaining 247 quantizing levels (not shown) are evenly dispersed across the four sub-regions. Each of these nine quantizing levels along with each of the other 247 quantizing levels is represented by an 8 bit word. FIG. 3 also shows the 8 bit words corresponding to each of the illustrated quantizing levels. In a 16 QAM format, each modulated carrier signal conveys information on any of four amplitude levels and these four amplitude levels have the values of $-3$, $-1$, $+1$, and $+3$ volts and respectively correspond to levels 303, 305, 307 and 309.

The arrangement of bits in each 8 bit word is determined using two's complement mathematics. For 16 QAM modulation, 2 bits of each 8 bit word represent one of the four possible transmitted amplitude levels and the remaining 6 bits denote the error or difference between the analog signal quantized by converter 101 and the closest one of the four possible transmitted signal levels. Specifically, the most-significant bit (MSB) or leftmost bit and the next most-significant (NMSB) bit in each output word denotes the closest one of the four possible transmitted signal levels, to the analog data signal on lead 103 at each quantizing time. Referring to FIG. 3, the MSB and NMSB of the quantizing levels lying in sub-region 320 are logical "1" and "0" respectively, and denote a transmitted signal level of $-3$ volts. Similarly, the quantizing levels in sub-regions 321-323, respectively, have an MSB and NMSB of logical "1" and "1", logical "0" and "0", and logical "0" and "1" to denote transmitted signal levels of $-1$, $+1$, and $+3$ volts. In addition, the MSB of all of the 8 bit words denotes the polarity of the quantized analog signal. Accordingly, an MSB of logical "0" indicates a positive polarity and is such for all quantizing levels in sub-regions 322 and 323, and an MSB of logical "1" indicates a negative polarity and is such for all quantizing levels in sub-regions 320 and 321. This polarity indication, as will be described, is advantageously utilized in the disclosed embodiment to provide independent adjustment of the top and bottom reference levels.

As previously stated, 6 bits in each 8 bit output word indicate the error of the quantized analog signal at each quantizing time with respect to the closest one of the four possible transmitted signal levels. In addition, one of these 6 bits indicates the polarity or sign of this error. This error sign bit (ESB) is the third bit position from the left in each 8 bit output word and is shown in FIG. 3. As illustrated, any quantizing level lying below the middle of its associated sub-region has a logical "0" ESB and any quantizing level lying above the middle of its associated sub-region has a logical "1" ESB. For example, quantizing levels for sub-region 322 lying between levels 306 and 307 have a logical "0" ESB and those quantizing levels lying between levels 307 and 308 have a local "1" ESB. The ESB, as will be described hereinafter, is used by the present invention to optimally position the quantizing levels. In this regard, it should be noted that if the distortion producing the error in the quantized analog signal is random, then there is an equal likelihood of the ESB being a logical "0" or "1". However, if the analog signal is attenuated by distortion, then there is a greater occurrence of logical "0s" than logical "1s" for analog signals lying in sub-regions 322 or 323. Similarly, if the signal at one time is amplified, then there is a greater occurrence of logical "1s" than logical "0s" for analog signals lying in sub-regions 322 or 323. The opposite result applies for signals lying in sub-regions 320 and 321. The present invention corrects both of these situations, which can result in an incorrect determination of the transmitted signal levels, by integrating the ESB on bus 106 and varying the position of the quanziting levels in response thereto.

Now, refer back to FIG. 1. Data detector 104 in top reference voltage generator 102 ascertains the presence of the analog data signal on lead 103 and provides an enable signal which is coupled to one input of AND gate 112, digital one shot 107 and to RAM 124. Detector 104 is advantageously utilized when the disclosed embodiment is disposed in a location, such as the hub or any of the remote locations 202-1 through 202-N of FIG. 2, wherein the analog signal may be received in bursts. RAM 124 is preferably employed when the disclosed embodiment is used in a location where the incoming analog data signal is received from different communication paths, such as in the case of signals arriving at hub location 201 of FIG. 2.

D-type flip-flops 110 and 111, strobed by the baud clock, respectively toggle the MSB and ESB to their $\bar{Q}$ outputs on each occurrence of the baud clock. The $\bar{Q}$ output of flip-flop 111 is coupled to an input of AND gate 112 which produces a logical "1" pulse when an analog data signal is present on lead 103 which falls into either sub-region 322 or 323 of FIG. 2. This logical "1" output enables up/down counter 115. Accordingly, this counter only responds for analog data signals having a positive polarity. Once enabled, up/down counter 115 increments its count by one for each logical "1" $\bar{Q}$ output of flip-flop 110 and decrements its count by one for each logical "0" output of this flip-flop. If not enabled, counter 115 maintains its stored count or accepts a new count via bus 116. Accordingly, if the top reference voltage is optimally positioned, the count stored by counter 115 oscillates about some fixed count in response to positive polarity analog data signals. Such optimal positioning occurs when there is an equal likelihood of a positive or negative error signal polarity for a quantized positive polarity analog signal. If, however, the value of the top reference voltage is too low or, equivalently, the positioning of outermost quantizing level 310 is too low, the count stored in counter 115 will increase and, in response thereto, top reference voltage generator 102 will increase the top reference voltage so as to raise the position of outermost quantizing level 310 to the optimal position. Similarly, if the top reference voltage or the position of quantizing level 310 is too high, the count stored in counter 115 will decrease and the top reference voltage and position of outermost quantizing level 310 will be lowered by generator 102.

The count stored in counter 115 appears on bus 114 and is coupled to D/A converter 113 wherein it is transformed into an analog signal on each baud clock pulse. This analog signal is coupled to one input of difference amplifier 117 which is configured with input and feedback resistors 120 and 119, respectively. Resistor offset network 118 supplies an offsetting signal to the other input of difference amplifier 117. The output of difference amplifier 117 is the top reference voltage which is supplied to A/D converter 101. This top reference voltage along with a bottom reference voltage provided by bottom reference voltage generator 122 determines the positioning of the other 254 quantizing levels. Advantageously, the positioning of the quantizing levels corresponding to the maximum and minimum transmitted signal levels, i.e, quantizing levels 303 and 309, is set to extend over ¾ of the distance between the top and bottom reference voltages via the offset signal provided by network 118. In addition, to prevent false locks, the swing of D/A converter 113 is preferably limited to +/−32 least significant bits around quantizing levels 303 and 309.

When the disclosed embodiment is used in applications such as hub location 201, storing the optimal position of the top reference voltage for analog data signals arriving from each of a plurality of remote locations advantageously reduce the convergence time of the adaptive circuitry. To achieve this benefit, RAM 124 stores the count of counter 115 appearing on bus 114. A read/write control pulse, which extends for one baud clock period, is provided by digital one shot 107 for RAM 124 in response to the enable signal on lead 105. The rising edge of this pulse serves as a read signal for the RAM and the trailing edge serves as a write signal. This pulse on lead 108 from digital one-shot 107 also serves as a load signal for counter 115. Accordingly, at the onset of an analog data burst from a particular remote location, the count of counter 115 associated with the last transmitted data burst from this particular remote location is read out from the RAM and loaded into counter 115 via bus 116. Bus 116 is connected to the presettable counter input terminals. At the end of the burst, the current state of counter 115 is written into RAM 124 and is used as an initial count for the next transmission from this particular remote location. The RAM memory address into which and from which the count is stored and retrieved is controlled by the TDMA controller (not shown). This controller, in well-known fashion, assigns the TDMA time slots in accordance with a predetermined algorithm to the various remote locations. Use of RAM 124 and digital one shot 107 is not required in applications wherein the analog data signal is not arriving over different transmission paths. In such case, these devices can be deleted and the presettable counter input leads of counter 115 are grounded.

Bottom reference voltage generator 122 includes substantially identical circuitry to that described for generator 102 to provide control of the bottom reference voltage independently of any change in the top reference voltage. This advantageously allows for unsymmetrical unwanted amplitude shifts of the analog data signal on lead 103. The up/down counter in generator 122 is only enabled when analog data is present which lies in either sub-regions 320 or 321. If there are more logical "0" ESBs than logical "1" ESBs, generator 122 lowers the bottom reference voltage or position of quantizing level 302. Similarly, if there are more logical "1" ESBs than logical "0" ESBs, generator 122 raises the bottom reference voltage or position of quantizing level 302. A/D converter 101 utilizes a resistor ladder, in well-known fashion, to derive the position at each of the quantizing levels located between the outermost quantizing levels 302 and 310. Accordingly, a change in the position of either quantizing level 302 or 310 will produce a corresponding change in the location of each of the other quantizing levels.

It should, of course, be understood that while the present invention has been disclosed with respect to a particular embodiment, numerous modifications should be apparent to those skilled in the art. For example, while uniformlyspaced quantizing levels are used in the disclosed embodiment, the spacing between successive quantizing levels need not be the same but can vary in accordance with any formulation. Or, while both of the outermost levels are adjusted in the disclosed embodiment, either one of these levels can be fixed and the other level adjusted if such is desirable.

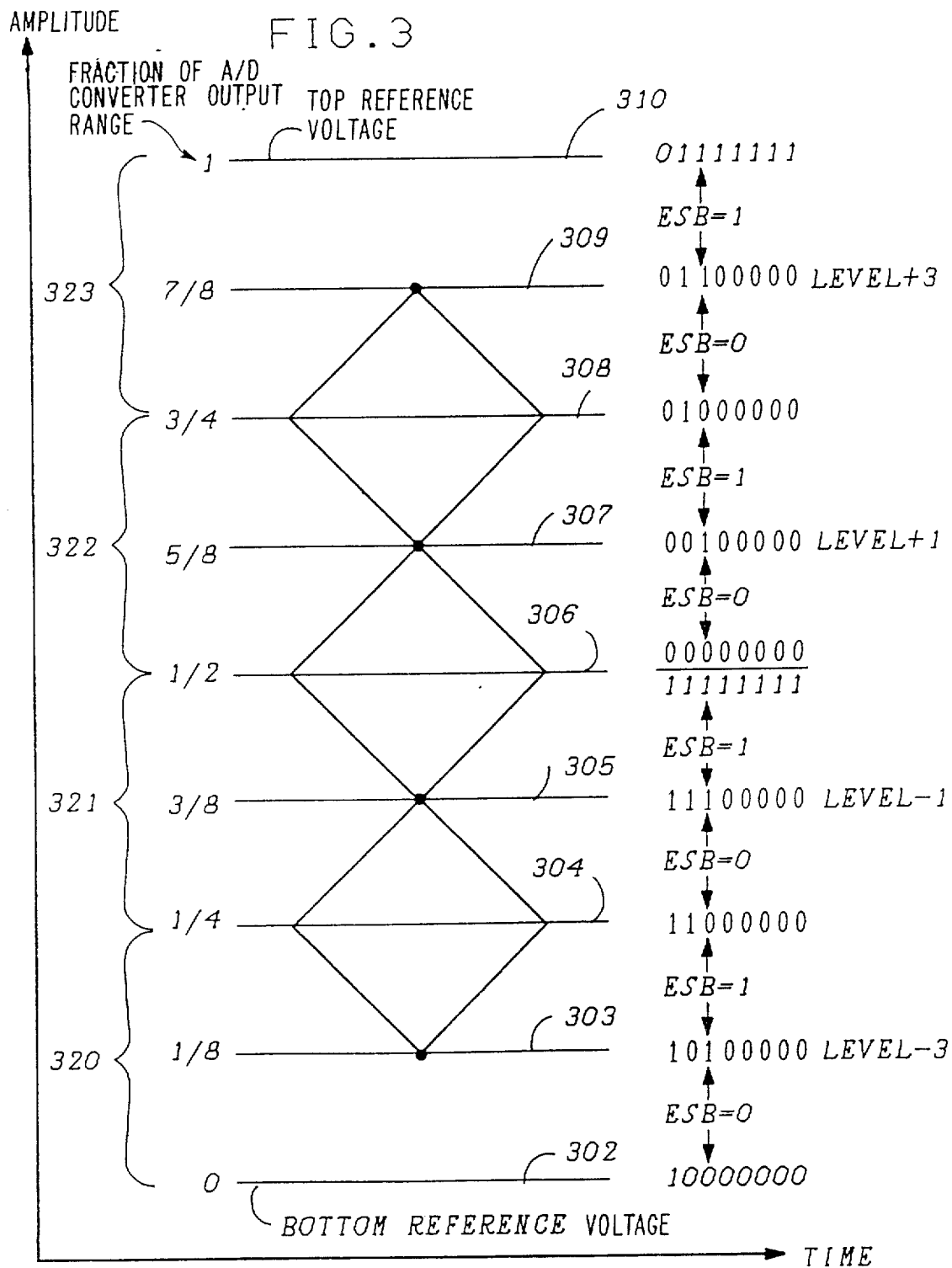

What is claimed is:

1. Signal conversion apparatus comprising
an analog-to-digital converter having a plurality of quantizing levels extending over a predetermined range, said converter assigning the amplitude of an analog data signal at each of a plurality of predetermined times to one of said plurality of quantizing levels, the assignment providing a digital output comprising a plurality of bits whose values are independent of one another, and
means responsive to said digital output for varying said predetermined amplitude range, said varying means expanding said predetermined range in response to one value of a predetermined bit in each digital output and compressing said predetermined bit in response to another value of said predetermined bit.

2. The apparatus of claim 1 wherein said varying means comprises means for determining the presence of said analog data signal, and said determining means only enabling said varying means in the presence of said analog data signal.

3. The apparatus of claim 1 wherein said analog input signal arrives from different communication paths and said varying means includes means for storing quantizing levels for an analog signal arriving over each communication path.

4. The apparatus of claim 3 wherein said varying means establishes quantizing levels for a particular communication path each time said analog data signal arrives from said particular communication path.

5. The apparatus of claim 4 wherein said varying means includes means for revising said quantizing levels for each communication path.

6. The apparatus of claim 1 wherein each digital output includes a plurality of bits and said varying means integrates said preselected bit in each digital output.

7. The apparatus of claim 1 wherein said varying means includes an up/down counter.

8. The apparatus of claim 1 wherein said varying means includes a random access memory.

9. The apparatus of claim 1 wherein said varying means adjusts the distance between outermost ones of said quantizing levels, this distance, in turn, being used to determine the positioning of other quantizing levels.

10. The apparatus of claim 1 wherein the number of quantizing levels in said plurality is a predetermined constant regardless of said range.

11. The apparatus of claim 1 wherein said predetermined bit has a value representative of the amplitude of said analog data signal at each one of said predetermined times relative to the assigned one of said plurality of quantizing levels.

12. The apparatus of claim 1 wherein said digital output includes another bit representative of the amplitude of said analog data signal at said one predetermined time relative to a zero amplitude.

13. The apparatus of claim 2 wherein said varying means varies a particular outermost one of said quantizing levels in response to an associated value of said another bit.

14. A method of adjusting an analog-to-digital converter, said method comprising the steps of assigning an analog data signal amplitude at each of a plurality of predetermined times to one of a plurality of quantizing levels which extend over a preselected range, the assignment providing a digital output comprising a plurality of bits whose values are independent of one another, and varying said preselected range in response to said digital output said varying means expanding said predetermined range in response to one value of a predetermined bit in each digital output and compressing said predetermined bit in response to another value of said predetermined bit.

* * * * *

UNITED STATES PATENT AND TRADEMARK OFFICE
CERTIFICATE OF CORRECTION

PATENT NO. : 4,831,382

DATED : May 16, 1989

INVENTOR(S) : Walter Debus, Jr. and Gerhard W. Stenger

It is certified that error appears in the above-identified patent and that said Letters Patent is hereby corrected as shown below:

Column 3, line 15, "to a pair" should read --of a pair--; line 20, "seqeunce" should read --sequence--. Column 4, line 17, "local" should read --logical--. Column 5, line 39, "reduce" should read --reduces--. Column 6, line 27, "uniformlyspaced" should read --uniformly-spaced--; line 49, "bit" should read --range--. Column 8, line 3, "2" should read --12--; line 19, "bit" should read --range--. In the drawings, FIG. 3 should appear as shown on the attached sheet.

Signed and Sealed this

Twenty-fourth Day of July, 1990

Attest:

HARRY F. MANBECK, JR.

Attesting Officer      Commissioner of Patents and Trademarks